United States Patent [19]
Toya et al.

[11] Patent Number: 5,178,727
[45] Date of Patent: Jan. 12, 1993

[54] CERAMIC MEMBRANE DEVICE AND A METHOD OF PRODUCING THE SAME

[75] Inventors: Eiichi Toya; Yukio Itoh; Tadashi Ohashi; Masayuki Sumiya, all of Oguni, Japan

[73] Assignee: Toshiba Ceramics Co., Ltd., Japan

[21] Appl. No.: 831,752

[22] Filed: Feb. 10, 1992

Related U.S. Application Data

[63] Continuation of Ser. No. 620,417, Dec. 3, 1990, abandoned.

[30] Foreign Application Priority Data

Dec. 8, 1989 [JP] Japan .................................. 1-319659

[51] Int. Cl.$^5$ ........................ B44C 1/22; C03C 15/00; C03C 25/06
[52] U.S. Cl. .................................. 156/644; 156/646; 156/657; 156/659.1; 156/663; 427/249; 428/137; 430/5
[58] Field of Search ............... 156/628, 644, 646, 652, 156/653, 657, 659.1, 662, 663; 430/5; 427/249, 294; 428/137, 138

[56] References Cited
U.S. PATENT DOCUMENTS

| | | | |
|---|---|---|---|
| 4,804,600 | 2/1989 | Kuto et al. | 430/5 |
| 4,941,942 | 7/1990 | Bruns et al. | 430/5 |

Primary Examiner—William A. Powell
Attorney, Agent, or Firm—Lorusso & Loud

[57] ABSTRACT

A ceramic membrane device for a photomask is a ring-shaped base plate constituting a circumferential frame and having a flat front surface, an outer side surface and a rear surface, a front CVD coating supported on the front surface of the base plate and defining a flat surface on which a masking pattern is to be formed, and a rear CVD coating formed on the rear surface of the base plate. The front and rear CVD coatings are made of a silicon compound. The ceramic membrane device is made by providing a plate having a flat front surface, a side surface and a rear surface, forming a front CVD coating made of a silicon compound on the side surface and the front surface of the plate, forming a rear CVD coating made of a silicon compound on a partial area of the rear surface of the plate so that an uncoated area remains, removing the portion of the plate corresponding to the uncoated area by means of etching so that the remaining portion of the plate can function as a circumferential frame for the ceramic membrane formed by the front coating.

9 Claims, 4 Drawing Sheets

CERAMIC MEMBRANE DEVICE AND A METHOD OF PRODUCING THE SAME

This application is a division of application Ser. No. 07/620,417, filed Dec. 3, 1990, now abandoned.

BACKGROUND OF THE INVENTION

This invention relates to a ceramic membrane device which is suitable for a photomask and to a method for producing the ceramic membrane device.

When processing an integrated circuit, a photomask is used for the purpose of forming a pattern of electronic circuits or masking a pattern on a wafer. A conventional ceramic membrane device is composed of a ring-shaped base plate made of silicon and a circular ceramic coating supported on the base plate.

In the conventional ceramic membrane device, the ceramic coating is formed on only one face of the base plate. Thus, the base plate is apt to be disadvantageously curved or bent because there is a difference in magnitude of thermal expansion between the silicon base plate and the ceramic coating. If the base plate is curved, the ceramic coating is also curved so that its flatness deteriorates. In case of a curved ceramic membrane on which a masking pattern is formed, the pattern formed on a wafer by means of an X-ray will be faulty.

SUMMARY OF THE INVENTION

An object of the present invention is to provide a ceramic membrane device in which a silicon base plate and a ceramic coating can be prevented from being disadvantageously curved.

Another object of the present invention is to provide a process of producing such a ceramic membrane device.

According to the present invention, a ceramic membrane device comprises a base plate constituting a circumferential frame, the base plate having a central opening a flat front surface, a side surface and a rear surface which constitute a continuous surface, a front coating supported on the front surface of the base plate and having a flat surface on which a masking pattern is to be formed, a side coating supported on the side surface of the base plate, a rear coating formed on the rear surface of the base plate, the front coating, the side coating and the rear coating being continuously and integrally made of a silicon compound.

According to the present invention, also, a process for producing a ceramic membrane device includes the steps of providing a plate having a flat front surface, a side surface and a rear surface, forming a front CVD coating made of a silicon compound on the side surface and the front surface of the plate, forming a rear CVD coating made of a silicon compound on a partial area of the rear surface of the plate so that an uncoated area remains, removing a portion of the plate corresponding to the uncoated area by means of etching so that the remaining portion of the plate can function as a circumferential frame for the ceramic membrane device.

The base plate is preferably made of silicon.

The base plate has preferably a thickness of 100–1000 microns. If the thickness is less than 100 microns, the strength of the base plate is not sufficient so that the base plate is apt to be curved or cracked. If the thickness is larger than 1000 microns, the amount of the portion to be removed by etching is so large that manufacturing cost is increased.

The front and rear coatings are preferably made of silicon carbide or silicon nitride or a combination thereof.

The front coating has preferably a thickness of 0.1–20 microns. If the thickness of the front coating is less than 0.1 microns, the strength of the coating is not sufficient so that the coating is apt to be cracked or broken. If the thickness of the front coating is larger than 20 microns, the coating is apt to be peeled from the base plate because of a difference in coefficients of thermal expansion between them.

The rear coating has preferably a thickness of 0.85–1.15 times as large as the front coating. If the thickness of the rear coating is out of this range, thermal stress between the front and rear coatings cannot balance so that cracks will be produced.

The front and rear coatings are preferably formed on the base plate by means of CVD.

The uncoated area of the plate is preferably removed by means of etching with gas such as HCl gas, etc., to form a central opening.

DETAILED DESCRIPTION OF THE PREFERRED EMBODIMENTS

Figure 1:
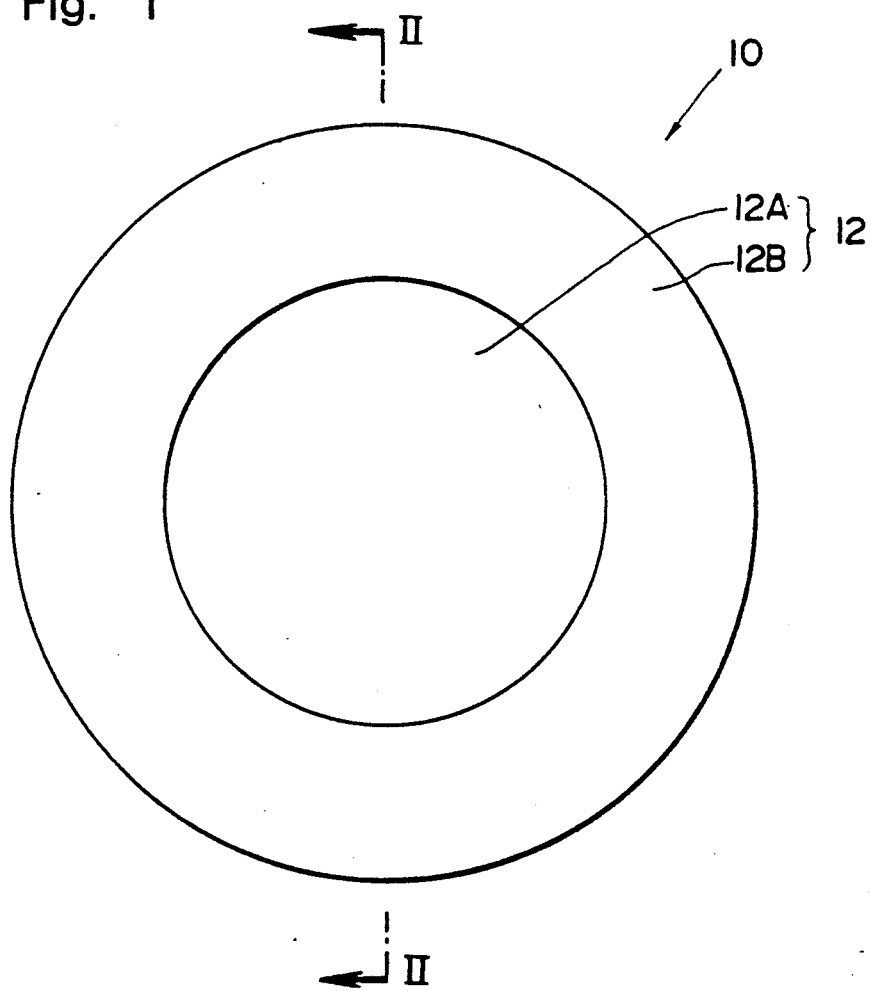
FIG. 1 is a plan view showing a ceramic membrane device according to a preferred embodiment of this invention.
Figure 2:
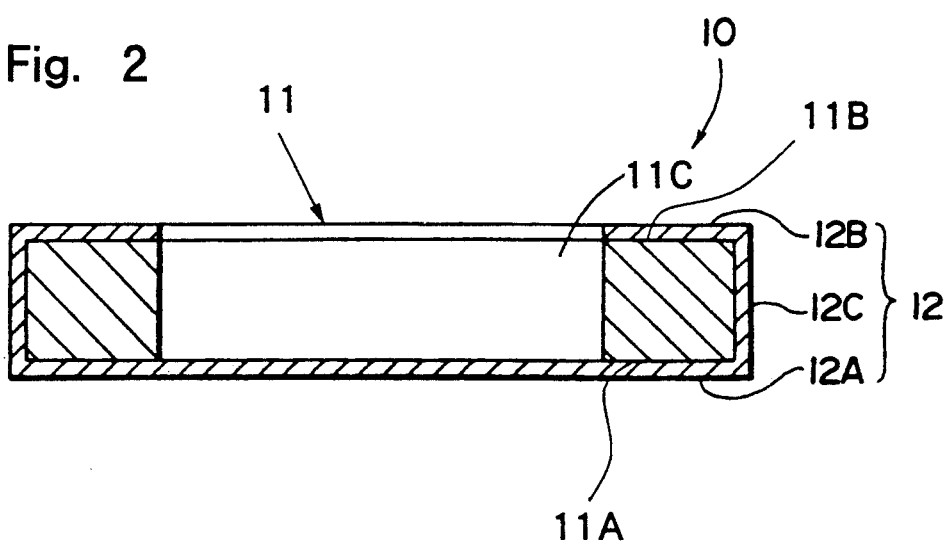
FIG. 2 is a sectional view taken along the line II—II in FIG. 1 in which the thickness is very enlarged.

FIGS. 1 and 2 show a first embodiment of the present invention.

A ceramic membrane device 10 is generally formed in the shape of a disk. The ceramic membrane device 10 comprises a base plate 11 and three ceramic coatings 12.

The base plate 11 is ring-shaped and made of silicon. The base plate 11 has a front surface 11A and a rear surface 11B both of which are mirror-finished surfaces. The base plate 11 has a central opening 11c in the shape of a cylindrical bore and a thickness of 100–1000 microns.

The ceramic coatings 12 are a front coating 12A, a rear coating 12B and a side coating 12C.

The front, side and rear coatings are integrally and continuously formed on the base plate 11. The front coating 12A is circular in top view and supported on the front surface of the base plate. The front coating 12A is made of a silicon compound such as silicon carbide or silicon nitride. The rear coating 12B is a ring-shaped coating formed on the rear surface of the base plate. The front coating 12A has a thickness of 0.1–20 microns. The rear coating 12B has a thickness of 0.85–1.15 times as large as the front coating 12A.

A flat surface is defined by the front coating 12A, on which a pattern of electronic circuits (not shown) is to be formed by a conventional method.

Figure 3:
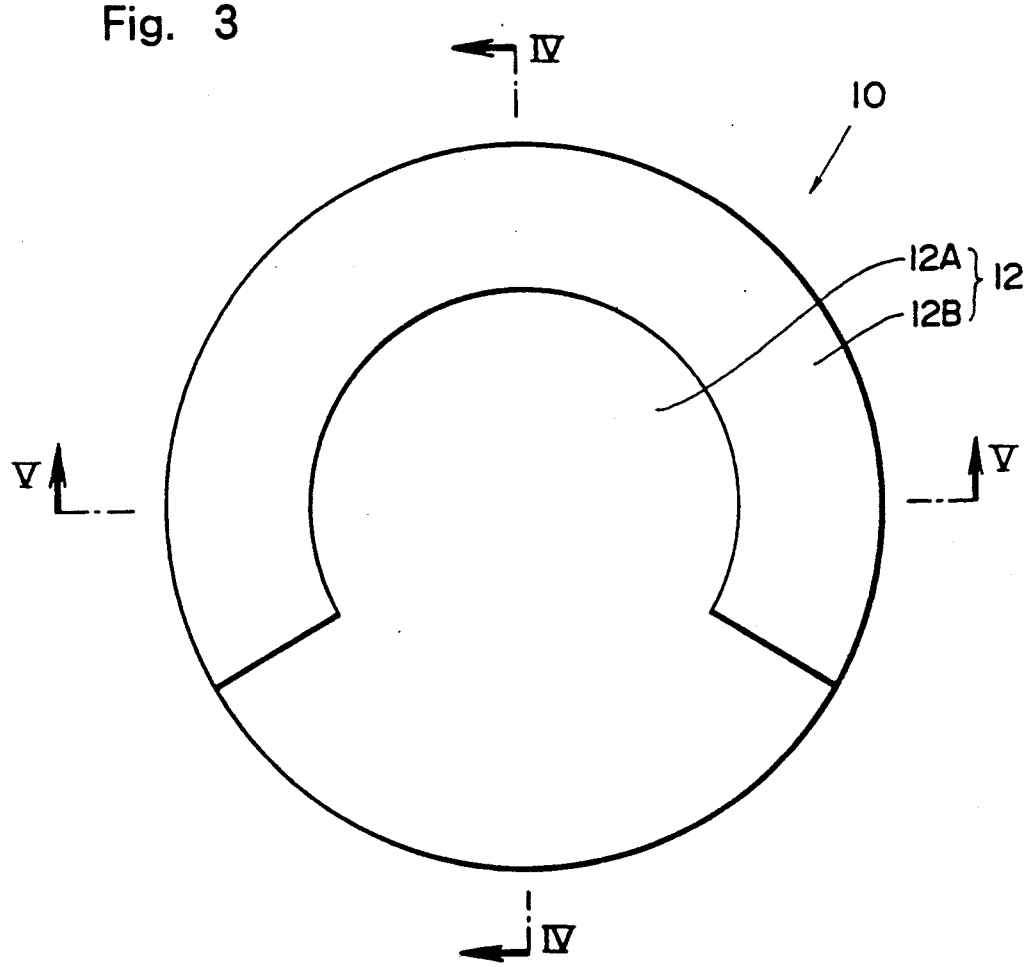
FIG. 3 is a plan view showing a ceramic membrane device according to another embodiment of this invention.
Figure 4:
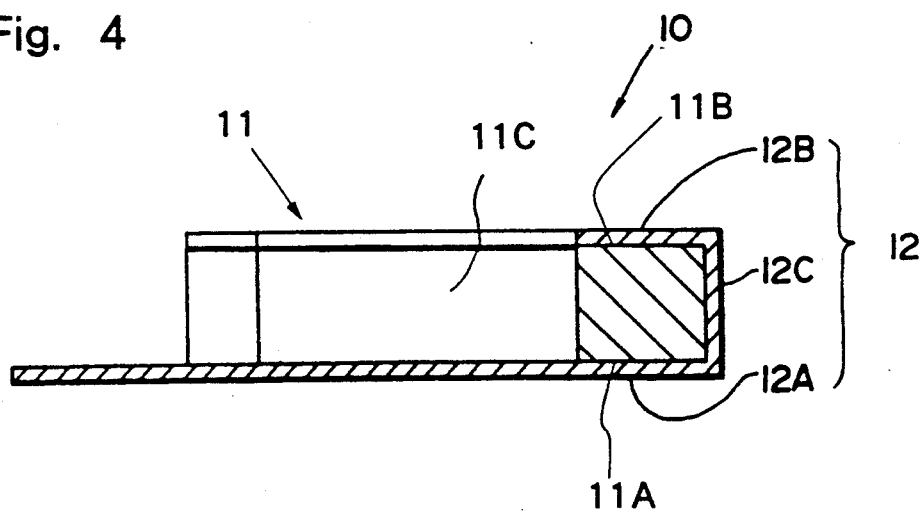
FIG. 4 is a sectional view taken along the line IV—IV in FIG. 3 in which the thickness is very enlarged.

FIGS. 3 and 4 show another embodiment of the present invention. The ceramic membrane device 10 is similar to the ceramic membrane shown in FIGS. 1 and 2 except that a base plate 11 constitutes a horseshoe-shaped frame. In other words, the ring-shaped frame is partially cut. The cut portion must be less than ⅔ of the entire circular length of the ring. The ceramic membrane device 10 of the second embodiment is lighter than that of the first embodiment.

A preferred method of producing the ceramic membrane device will be described referring to FIGS. 5a to 5f:

A silicon plate 11 is provided, which is a circular disc having a thickness of 100–1000 microns as shown in FIG. 5 a. Both a front surface 11A and a rear surface 11B of the plate 11 are finished so as to have mirror-like surfaces.

Figure 5A:
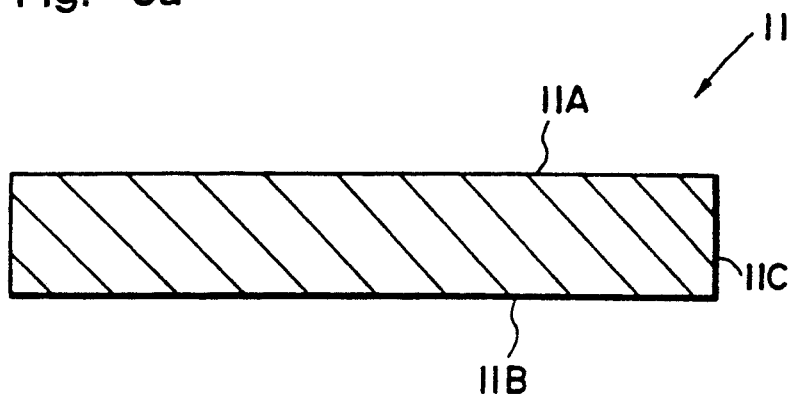
FIGS. 5a to 5f are sectional views showing the steps of producing a ceramic membrane device in which the thickness is very enlarged.
Figure 5B:
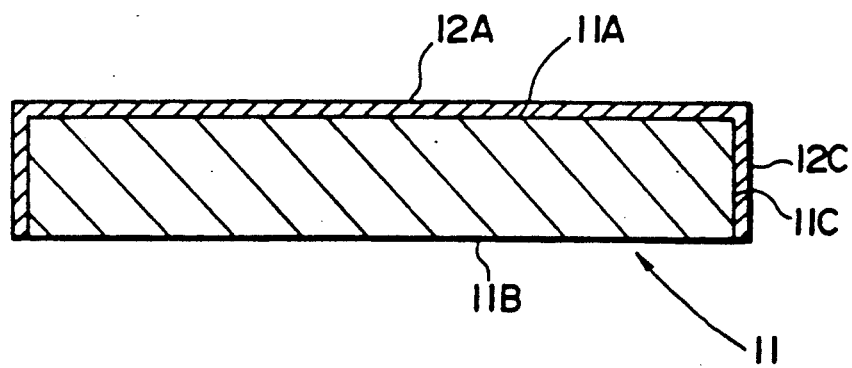

The ceramic coatings 12A, 12C are formed on the front surface 11A and a side surface 11C within a heat treatment furnace by means of a CVD (Chemical Vapor Deposition) method at the same time as shown in FIG. 5b. The ceramic coatings 12A, 12C are made of a silicon compound such as silicon carbide or silicon nitride. The coatings have a thickness of 0.1–20 microns.

Figure 5C:
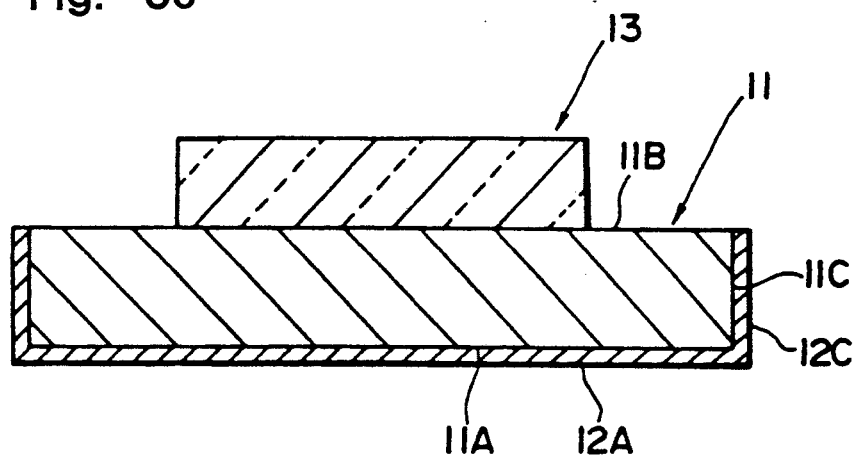

The plate 11 is turned over, and then a small circular plate 13 made of a fused silica glass or quartz glass is put on the rear surface 11B of the plate 11 as shown in FIG. 5c.

Figure 5D:
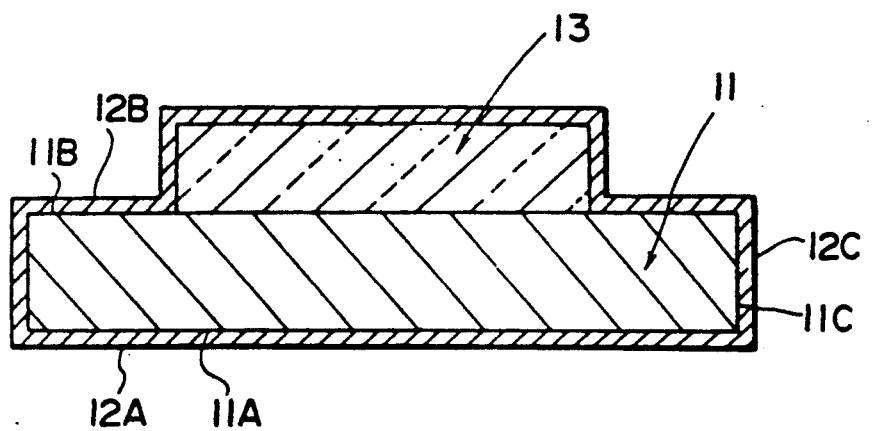

A ceramic coating 12B is formed on the rear surface 11B of the plate 11 and on the small plate 13 within a heat treatment furnace by means of a CVD method at the same time as shown in FIG. 5d. The ceramic coating 12B is made of a silicon compound such as silicon carbide or silicon nitride and has a thickness of 0.85–1.15 times as large as the ceramic coating 12A.

Figure 5E:
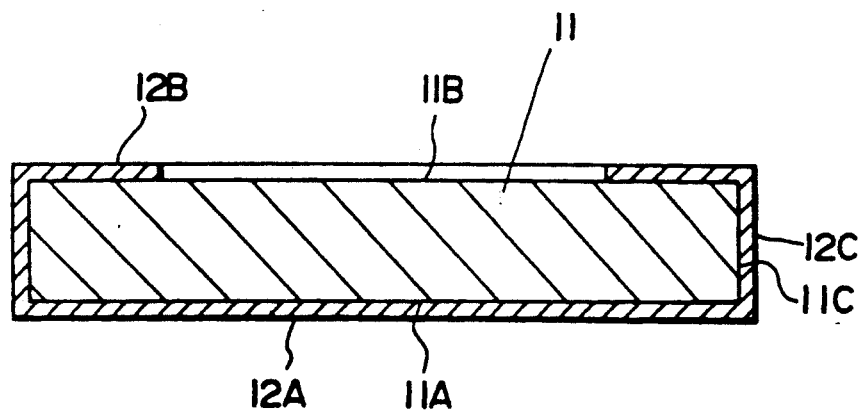
Figure 5F:
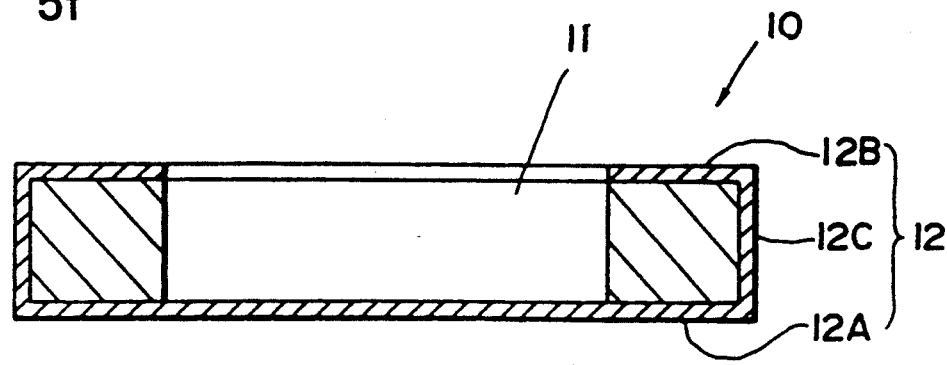

The small plate 13 is removed so that a circular uncoated area is exposed on the rear surface 11B of the plate 11 as shown in FIG. 5e.

The uncoated or exposed portion of the plate 11 is subjected to an etching treatment by HCl gas in a furnace so that a central circular portion of the base plate is removed. The remaining ring-shaped portion of the base plate constitutes a circumferential frame of the ceramic membrane device. As a result, the ceramic membrane 10 shown in FIG. 5 is produced.

A portion to be removed from the plate by etching can be formed in any desired shape other than a circular one. In such a case, a small plate (not shown) should correspond in shape to the portion to be removed. For example, when a portion to be removed is ellipse-shaped, an ellipse-shaped quartz glass plate is used.

To further illustrate this invention, and not by way of limitation, the following examples are given.

EXAMPLES 1–3

A silicon plate had mirror-finished front and rear surfaces, a diameter of 100 mm and a thickness of 400 microns. While the surface of the silicon plate was maintained at 1300° C. within a furnace, a mixed gas consisting of $SiCl_4$ gas as a silicon source, $C_3H_8$ gas as a carbon source and $H_2$ gas as a carrier gas was supplied to the furnace at 15 l/min for one minute. As a result, a silicon carbide coating having a thickness of 1 micron was formed on the front and side surfaces of the plate.

The plate was cooled and taken out of the furnace. It was turned over, and a small circular plate made of a fused silica glass was placed on the rear surface of the plate. After that, it was again set in the furnace and heated so as to be maintained at 1300° C.

The above-stated mixed gas was introduced in the furnace at a flow speed of 15 l/min for 50 seconds (Example 1), 1 minute (Example 2) and 70 seconds (Example 3). As a result, a silicon carbide coating was formed on the rear surface of the plate. The thicknesses were 0.85 micron (Example 1), 1 micron (Example 2) and 1.15 micron (Example 3).

The plate was cooled and taken out of the furnace and then the small plate was removed so that a circular area having no coating was exposed.

The plate was again set in the furnace and heated so as to be maintained at 1100° C. The portion of the plate corresponding to the circular exposed portion was subject to an etching treatment by HCl gas so as to be removed. Thus, a circumferential frame was formed As a result, the ceramic membrane devices of Examples 1, 2 and 3 were produced.

As shown in Table 1, the front and rear coatings had uniform thicknesses. There were no cracks in the front coating. The plate was not curved or bent. The etching time could be shortened.

EXAMPLES 4–6

The procedures of Examples 4–6 are substantially the same as those of Examples 1–3 except a front coating thickness of 10 micron meters and rear coating thicknesses of 8.5, 10 and 11.5 microns.

As shown in Table 1, the front and rear coatings had uniform thicknesses where were no cracks in the front coating. The plate was not curved or bent. The etching time could be shortened.

EXAMPLES 7–9

The procedures of Examples 7–9 are substantially the same as those of Examples 1–3 except for a front coating thickness of 20 micron meters and rear coating thicknesses of 17, 20 and 23 microns.

As shown in Table 1, the front and rear coatings had uniform thicknesses. There were no cracks in the front coating. The plate was not curved or bent. The etching time could be shortened.

COMPARATIVE EXAMPLE 11–12

The procedures were substantially the same as Examples 1–3 except for front coating thicknesses of 0.05 and 30 microns and rear coating thicknesses of 0.05 and 30 microns.

In Comparative Example 11, the coatings were not uniformely formed.

In Comparative Example 12, cracks were produced in the coatings.

COMPARATIVE EXAMPLES 13–14

The procedures were substantially the same as Examples 1–3 except for plate thicknesses of 100 and 1000 microns, a front coating thickness of 10 microns and rear coating thicknesses of 5 and 10 microns.

In Comparative Example 13, thicknesses of the coatings were very small so that the base plate was considerably curved.

In Comparative Examples 14, etching time was lengthened.

COMPARATIVE EXAMPLE 15

The procedures of Example 15 were substantially the same as Examples 1–3 except for a front coating thickness of 10 microns, a rear coating thickness of 10 microns, and a quartz glass plate being formed in the shape of a rectangle.

In Comparative Example 15, cracks were observed in the front coatings.

vantageous because the base plate is not curved. A ceramic coating supported on the base plate can maintain its good flatness. Such a ceramic membrane device is suitable for a photomask.

TABLE 1

|  |  | Ex. | | | | | | | | |
|---|---|---|---|---|---|---|---|---|---|---|
|  |  | 1 | 2 | 3 | 4 | 5 | 6 | 7 | 8 | 9 |
| base plate | thickness (microns) | 400 | 400 | 400 | 400 | 400 | 400 | 400 | 400 | 400 |
|  | configuration size (mm) | circular plate diameter is 100 | | | | | | | | |
| ceramic coating | thickness of front coating (microns) | 1 | 1 | 1 | 10 | 10 | 10 | 20 | 20 | 20 |
|  | thickness of rear coating (microns) | 0.85 | 1.0 | 1.15 | 8.5 | 10 | 11.5 | 17 | 20 | 23 |
|  | existence of cracks | no | no | no | no | no | no | no | no | no |
| small plate | configuration size (mm) | circular plate diameter is 75 | | | | | | | | |
| magnitude of curvature in base plate |  | aprx. 0 | | | | | | | | |

TABLE 2

|  |  | Comparative Ex. No. | | | | | | | | |
|---|---|---|---|---|---|---|---|---|---|---|
|  |  | 11 | 12 | 13 | 14 | 15 | 16 | 17 | 18 | 19 |
| base plate | thickness (microns) | 400 | 400 | 100 | 1000 | 400 | 400 | 400 | 400 | 400 |
|  | configuration size (mm) | circular plate diameter is 100 | | | | | * ** | circular plate diameter is 100 | | |
| ceramic coating | thickness of front coating (microns) | 0.05 | 30 | | 10 | 10 | 10 | 10 | 10 | 10 |
|  | thickness of rear coating (microns) | 0.05 | 30 | 5 | 10 | 10 | 10 | 8.0 | 12 | 5 |
|  | existence of cracks in coating | no | yes | yes | no | yes | yes | yes | yes | no |
| small plate | configuration size (mm) | circular plate diameter is 75 | | | | | * *** | circular plate diameter is 75 | | |
| magnitude of curvature in base plate |  | aprx. 0 | large | | aprx. 0 | | | 100 | 100 | 450 |

*rectangular plate
**side is 100
***side is 70

COMPARATIVE EXAMPLE 16

The procedures of Example 16 were substantially the same as Example 5 except for the silicon plate being formed in the shape of a rectangle and a quartz glass plate being formed in the shape of a circle.

In Comparative Example 16, cracks were observed in the front coatings.

COMPARATIVE EXAMPLES 17-18

The procedures were substantially the same as Examples 1-3 except for front a coating thickness of 10 microns and rear coating thicknesses of 8 and 12 microns.

In Comparative Examples 17-18, base plates were curved by 100 microns.

COMPARATIVE EXAMPLES 19-20

The procedures were substantially the same as Examples 1-3 except front a coating thickness of 20 microns, and rear coating thicknesses of 5 and 40 microns.

In Comparative Examples 19-20, cracks were observed in the coatings, and base plates were curved by 450 and 550 microns, respectively.

As will be apparent from Table 1, according to the present invention, the ceramic membrane device is advantageous because the base plate is not curved. A ceramic coating supported on the base plate can maintain its good flatness. Such a ceramic membrane device is suitable for a photomask.

What is claimed is:

1. A method for producing a ceramic membrane device, comprising the steps of:
   providing a silicon plate having a flat front surface, a side surface and a rear surface;
   forming, within a furnace, a front CVD coating of a silicon compound on the side surface and the front surface of the plate;
   forming, within a furnace, a rear CVD coating of a silicon compound on a partial area of the rear surface of the plate within a heated furnace so that an uncoated area remains;
   etching said plate by contacting said plate with HCl gas within a heated furnace to remove that portion of the plate corresponding to the uncoated area to expose an area of the front CVD coating corresponding to said uncoated area so that the remaining portion of the plate can function as a circumferential frame for the exposed area of said front CVD coating, which exposed area constitutes a ceramic membrane.

2. A method as claimed in claim 1, wherein said plate has a thickness of 100-1000 microns.

3. A method as claimed in claim 1, wherein said front coating has a thickness of 0.1-20 microns and said rear coating has a thickness of 0.85-1.15 times as large as said front coating.

4. A method as claimed in claim 1, wherein the steps of forming the front and rear CVD coatings and etching are carried out within the same furnace.

5. A method as claimed in claim 1, wherein said etching is carried out at about 1100° C. and the front and rear CVD coatings are formed at about 1300° C.

6. A method as claimed in claim 5, wherein said silicon compound is silicon carbide.

7. A method as claimed in claim 5, wherein said silicon compound is silicon nitride.

8. A method for producing a silicon membrane device for a photomask, comprising the steps of:
   providing a circular silicon plate having mirrorfinished front and rear surfaces;
   forming at about 1300° C. a front coating of a silicon compound over the whole area of said front surface of said plate by CVD;
   placing a fused glass or quartz glass cover over a central area of said rear surface of said plate, while leaving uncovered a circumferential area of said rear surface surrounding said cover;
   forming at about 1100° C. a rear coating made of a silicon compound on said circumferential area of said rear surface of said plate and on said cover;
   removing said cover from said central area of said rear surface of said plate so that said central area of said rear surface is exposed; and
   etching away, at about 1100° C., the portion of said plate corresponding to said exposed area thereby baring a portion of said front coating to form a membrane.

9. A method as claimed in claim 8, wherein the etching step and the steps of forming the front and rear CVD coatings are carried out within the same furnace.

* * * * *